June 16, 1959 W. H. COOPER 2,891,201
CRYSTAL CONTACT DEVICE
Filed Dec. 22, 1954
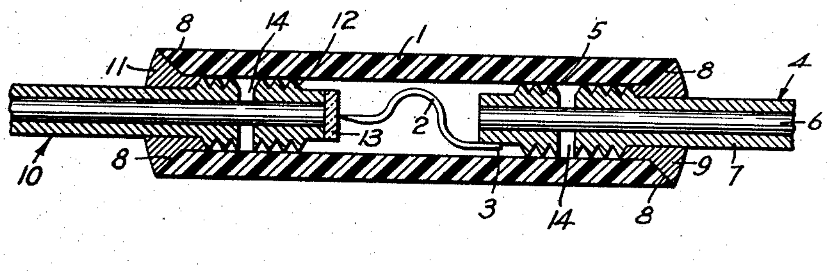
INVENTOR
WILLIAM H. COOPER
BY Philip M. Bolton
ATTORNEY 2,891,201

CRYSTAL CONTACT DEVICE

William H. Cooper, Larchmont, N.Y., assignor to International Telephone and Telegraph Corporation, New York, N.Y., a corporation of Maryland Application December 22, 1954, Serial No. 476,931

4 Claims. (Cl. 317—236)

This invention relates to the construction of a crystal contact device, such as a crystal diode, and particularly to the means for mounting the crystal and its contact electrode.

More specifically, the invention relates to means for reducing the thermal conductivity of the supporting means which supports the contact electrode and crystal within the housing.

This invention finds particular utility in the crystal contact device of the type in which the contact electrode (catwhisker) and the semi-conductor crystal are supported by means of metallic pins. The catwhisker and crystal electrodes are customarily mounted within a housing and held rigidly in place by metallic pins which are mounted by being pressed into the housing. In this type of diode construction, the catwhisker is spot welded or soldered to an end of one supporting pin and the crystal is soldered to the opposing end of the other pin. The pins are usually coated with a malleable metal so that upon being forced into the diode housing, the metal forms a tight, moisture-proof seal with the housing. This seal is improved by forming grooves on the surface of the pin which is forced into the housing, the peripheral edges between the grooves making contact with the housing. The unit is assembled by mounting the catwhisker-bearing pin and the crystal-bearing pin in the housing so that suitable pressure is applied between the point of the catwhisker and the crystal. The catwhisker-bearing pin is soldered in place before the crystal-bearing pin in order to minimize the amount of heat which is transmitted to the solder which fixes the crystal to its associated pin. Although the solder bond between the crystal and its supporting pin consists of a solder having a melting point higher than the solder sealing the pin to the housing, nevertheless many diodes are destroyed because the heat applied to form the final seal causes the solder bond holding the crystal to soften, thus permitting relative movement between the pin and the crystal. This has been a serious problem in the industry.

Accordingly, it is an object of this invention to provide supporting means for the crystal and the contact electrode which has a reduced thermal conductivity.

It is a further object of this invention to provide a means for reducing the thermal conductivity of the supporting pins which means requires no additional components and therefore, is inexpensive to manufacture.

In accordance with an aspect of the invention, there is provided a crystal contact device comprising a housing, a semi-conducting element, a contact electrode and means supporting the semi-conducting element and the contact electrode within a housing such that an end of the electrode is pressed against the semi-conducting element. The invention is characterized in that the supporting means includes means for reducing the thermal conductivity thereof.

The above-mentioned and other features and objects of this invention and the manner of attaining them will become more apparent and the invention itself will be best understood, by reference to the following description of an embodiment of the invention taken in conjunction with the accompanying drawings, wherein the figure is a cross-sectional view of a preferred embodiment of the crystal contact device.

Referring to the figure, there is illustrated a crystal diode comprising a hollow housing 1 which is made of an insulator material, such as a ceramic or a plastic. Inside the housing there is provided a catwhisker electrode 2 spot-welded or soldered, in a conventional manner, at 3 to a supporting pin 4. The supporting pin is preferably formed with a plurality of lands 5 which make pressed contact with the interior of the housing 1. Although the supporting pin 4 may be of a homogeneous material, it is preferably made of the material known by the trade name "copperweld." Copperweld is a material consisting of a steel core 6, clad with copper 7 and for the present application, plated with a tin-lead alloy. The conical surfaces 8 of the housing 1 are preferably fired with silver, flashed with copper and also plated with tin to facilitate soldering. A sealing solder 9 is provided to seal the supporting pin 4 to the housing 1. Similarly, at the opposite end of the housing 1, there is provided a supporting pin 10, sealed to the housing 1 by means of a solder blob 11 and provided with lands 12 which make pressed contact with the interior of the housing 1. The pin 10 is preferably of the same stock as the pin 4. At the end of the supporting pin 10 and is pressed engagement with the catwhisker 2, there is provided a semi-conducting crystal wafer 13, such as germanium or silicon wafer, which is solder to the pin 10. The heat which is applied to melt the solder 11 is conducted through the pin, and particularly through the copper coating to the solder bond between the crystal 13 and the pin 10. In accordance with the invention, this heat which has a deleterious effect on the bond is impeded or trapped before reaching the solder bond between the crystal and pin. The heat is trapped by removing the copper around the circumference over a given longitudinal distance of the pin, such as shown at 14. This in effect, provides a heat trap which reduces the thermal conductivity of the pin. If desired, more such grooves may be formed in the circumference of the pin or the grooves may be in the form of threads.

It is to be realized that the invention is equally applicable to pins made of a homogeneous material because in so reducing the diameter, the heat conducting path is constricted. It is also to be realized that the invention is applicable to area-contact devices as well as point-contact devices.

While I have described above the principles of my invention in connection with specific apparatus, it is to be clearly understood that this description is made only by way of example and not as a limitation of the scope of my invention as set forth in the objects thereof and in the accompanying claims.

What is claimed is:

1. A crystal contact device comprising a housing, a semi-conducting element, contact electrode, means supporting said semi-conducting element and said contact electrode within said housing such that an end of said electrode is pressed against said semi-conducting element, and characterized in that said supporting means comprises metallic pins reduced in radial cross-section for a length less than the complete length of said pins and intermediate the ends thereof, whereby the thermal conductivity of said pins is reduced.

2. The device according to claim 1 wherein each of said metallic pins consists of a core having a first coefficient of conductivity, and the core being clad with a metal having a higher coefficient of conductivity.

3. The device according to claim 2 wherein the means for reducing the thermal conductivity of the pins comprises removing a portion of the metal having the higher coefficient of conductivity, whereby the heat is forced to travel through said core.

4. The device according to claim 3 wherein said core is made of steel and said material cladding said core is made of copper.

References Cited in the file of this patent

UNITED STATES PATENTS

| | | |
|---|---|---|
| 756,676 | Midgley | Apr. 5, 1904 |
| 2,602,763 | Scaff et al. | July 8, 1952 |
| 2,694,168 | North et al. | Nov. 9, 1954 |
| 2,697,805 | Collins | Dec. 21, 1954 |
| 2,751,529 | Stineman et al. | June 19, 1956 |